US007804350B1

United States Patent
Edmondson et al.

(10) Patent No.: US 7,804,350 B1
(45) Date of Patent: Sep. 28, 2010

(54) LEVEL SHIFTING USING CROSS-COUPLED CASCODE TRANSISTORS

(75) Inventors: Charles A. Edmondson, Pocatello, ID (US); Joseph J. Walsh, Pocatello, ID (US)

(73) Assignee: Semiconductor Components Industries, LLC, Phoenxi, AZ (US)

( * ) Notice: Subject to any disclaimer, the term of this patent is extended or adjusted under 35 U.S.C. 154(b) by 0 days.

(21) Appl. No.: 12/428,285

(22) Filed: Apr. 22, 2009

(51) Int. Cl.
*H03L 5/00* (2006.01)

(52) U.S. Cl. ............................ 327/333; 326/63; 326/81

(58) Field of Classification Search ............. 326/62–63, 326/80–81; 327/306, 333
See application file for complete search history.

(56) References Cited

U.S. PATENT DOCUMENTS

| | | | |
|---|---|---|---|
| 5,539,334 A | 7/1996 | Clapp, III et al. | |
| 5,559,464 A * | 9/1996 | Orii et al. | 327/333 |
| 5,705,946 A | 1/1998 | Yin | |
| 5,736,869 A * | 4/1998 | Wei | 326/81 |
| 5,781,026 A | 7/1998 | Chow | |
| 5,821,800 A | 10/1998 | Le et al. | |
| 6,002,290 A | 12/1999 | Avery et al. | |
| 6,005,415 A | 12/1999 | Solomon | |
| 6,081,165 A * | 6/2000 | Goldman | 331/57 |
| 6,201,429 B1 | 3/2001 | Rosenthal | |
| 6,320,414 B1 | 11/2001 | Annema et al. | |
| 6,344,758 B1 | 2/2002 | Turner et al. | |
| 6,369,733 B1 | 4/2002 | Tucker et al. | |
| 6,407,579 B1 | 6/2002 | Goswick | |
| 6,477,091 B2 | 11/2002 | Tedrow et al. | |
| 6,487,687 B1 | 11/2002 | Blake et al. | |
| 6,535,019 B2 | 3/2003 | De Santis | |
| 6,614,283 B1 | 9/2003 | Wright et al. | |
| 6,683,486 B2 | 1/2004 | Hanson et al. | |
| 6,693,469 B2 | 2/2004 | Prodanov | |
| 6,774,696 B2 | 8/2004 | Clark et al. | |
| 6,774,698 B1 | 8/2004 | Bhattacharya et al. | |
| 6,803,801 B2 | 10/2004 | Randazzo et al. | |
| 7,002,371 B2 | 2/2006 | Kase et al. | |
| 7,061,298 B2 | 6/2006 | Mentze et al. | |
| 7,068,091 B1 | 6/2006 | Kwong | |
| 7,102,410 B2 | 9/2006 | Khan et al. | |
| 7,129,781 B2 | 10/2006 | Baskett | |

(Continued)

FOREIGN PATENT DOCUMENTS

EP 0748048 A1 11/1996

(Continued)

*Primary Examiner*—Dinh T. Le
(74) *Attorney, Agent, or Firm*—Robert F. Hightower

(57) ABSTRACT

A level-shifter circuit capable of operating at low voltages. Two complementary current paths are provided between each of two intermediate nodes (at least one of which being an output node) and one of the supply voltages. A network of field-effect transistors are coupled between the other voltage supply and the intermediate nodes. The transistors include a pull-up (or pull-down as the case may be) transistor pair coupled to the high (or low as the case may be) voltage supply. There are two cascode transistor pairs coupled between the pull-up (or down) transistors and the corresponding intermediate node. One cascode pair couples the respective intermediate node to the drain terminal of the respective pull-up (or down) transistor. The other cascoded pair cross-couples the intermediate node to the gate terminal of the opposite pull-up (or down) transistor.

21 Claims, 6 Drawing Sheets

U.S. PATENT DOCUMENTS

| | | |
|---|---|---|
| 7,151,400 B2 | 12/2006 | Chen |
| 7,199,617 B1 | 4/2007 | Schrom et al. |
| 7,215,146 B2 * | 5/2007 | Khan .................. 326/83 |
| 7,236,410 B2 | 6/2007 | Schrom et al. |
| 7,324,097 B2 | 1/2008 | Koyama et al. |
| 2002/0047740 A1 | 4/2002 | Suzuki et al. |
| 2002/0088995 A1 | 7/2002 | De Santis |
| 2003/0184358 A1 | 10/2003 | Hanson et al. |
| 2004/0022112 A1 | 2/2004 | Tran et al. |
| 2004/0113677 A1 | 6/2004 | Clark et al. |
| 2005/0258864 A1 | 11/2005 | Chen et al. |
| 2005/0285658 A1 | 12/2005 | Schulmeyer et al. |
| 2006/0267414 A1 | 11/2006 | Han et al. |
| 2007/0008804 A1 | 1/2007 | Lu et al. |
| 2007/0241804 A1 | 10/2007 | Campardo et al. |
| 2008/0054941 A1 | 3/2008 | Lines |
| 2008/0100342 A1 | 5/2008 | Muhlbacher et al. |

FOREIGN PATENT DOCUMENTS

| | | |
|---|---|---|
| EP | 0748048 B1 | 10/2004 |

* cited by examiner

LEVEL SHIFTING USING CROSS-COUPLED CASCODE TRANSISTORS

BACKGROUND

Some circuits have lower voltage portions that operate at a lower supply voltage and higher voltage portions that operate at a higher supply voltage. Level-shifters convert a lower voltage control signal received from a lower voltage portion (hereinafter, a "controlling circuit") of the circuit into a higher voltage control signal suitable for controlling a higher voltage portion (hereinafter, a "controlled circuit") of the circuit.

In some cases, the controlled circuit might have a varying voltage supply. Sometimes, the controlled circuit might operate with the high voltage supply as explained above (hereinafter called the "high voltage condition" of the controlled circuit). But other times, the controlled circuit might operate with a lower voltage supply, perhaps even as low as, or even lower than, the voltage supply of the controlling circuit (hereinafter called the "low voltage condition" of the controlled circuit). For instance, an Electrically Erasable and Programmable Read-Only Memory (EEPROM) might sometimes operate in a low voltage condition during a read operation, but might operate at a high voltage condition during a program operation.

In order to support this switching operation, the level-shifter and the controlled circuit often begins the programming operation in a low voltage condition. Then, the supply voltage to the level-shifter is raised causing the controlled circuit to transition to the high voltage condition. The supply voltage is then lowered again causing the controlled circuit to return to the low voltage condition.

For proper operation, the output of the level-shifter should be responsive to the input signal of the level-shifter, even at the low voltage condition. In other words, the output signal should switch to the state corresponding to the input signal state, even if the level-shifter has a lower voltage supply.

BRIEF SUMMARY

Embodiments described herein relate to a level-shifter. While not required, the level-shifter may be capable of switching quickly and reliably even at low supply voltages. The level-shifter includes at least one input node and two intermediate nodes, at least one of which, and potentially both of which, being an output node. The circuit includes two supply voltage nodes of opposite polarities. Two selectable current paths are provided between each of the intermediate nodes and one of the supply voltages. The two selectable current paths are configured to be alternately opened and conducting current in a complementary manner in response to the input signal. A network of field-effect transistors is coupled between the other voltage supply and the intermediate nodes.

The network of transistors include a pull-up (or pull-down as the case may be) transistor pair coupled to the high (or low as the case may be) voltage supply. There are two cascode transistor pairs coupled between the pull-up (or down) transistors and the corresponding intermediate node. One cascode pair couples the respective intermediate node to the drain terminal of the respective pull-up (or down) transistor. The other cascoded pair cross-couples the intermediate node to the gate terminal of the opposite pull-up (or down) transistor.

In this cross-coupled configuration, the voltage at the gate terminal of the pull-down transistor may be drawn lower (or in the case of a pull-up transistor, the gate terminal of the pull-up transistor may be drawn higher). This results in a much faster switching operation at a given supply voltage, even in a low voltage environment in which the supply voltage is quite low.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which.

DETAILED DESCRIPTION

Figure 1:
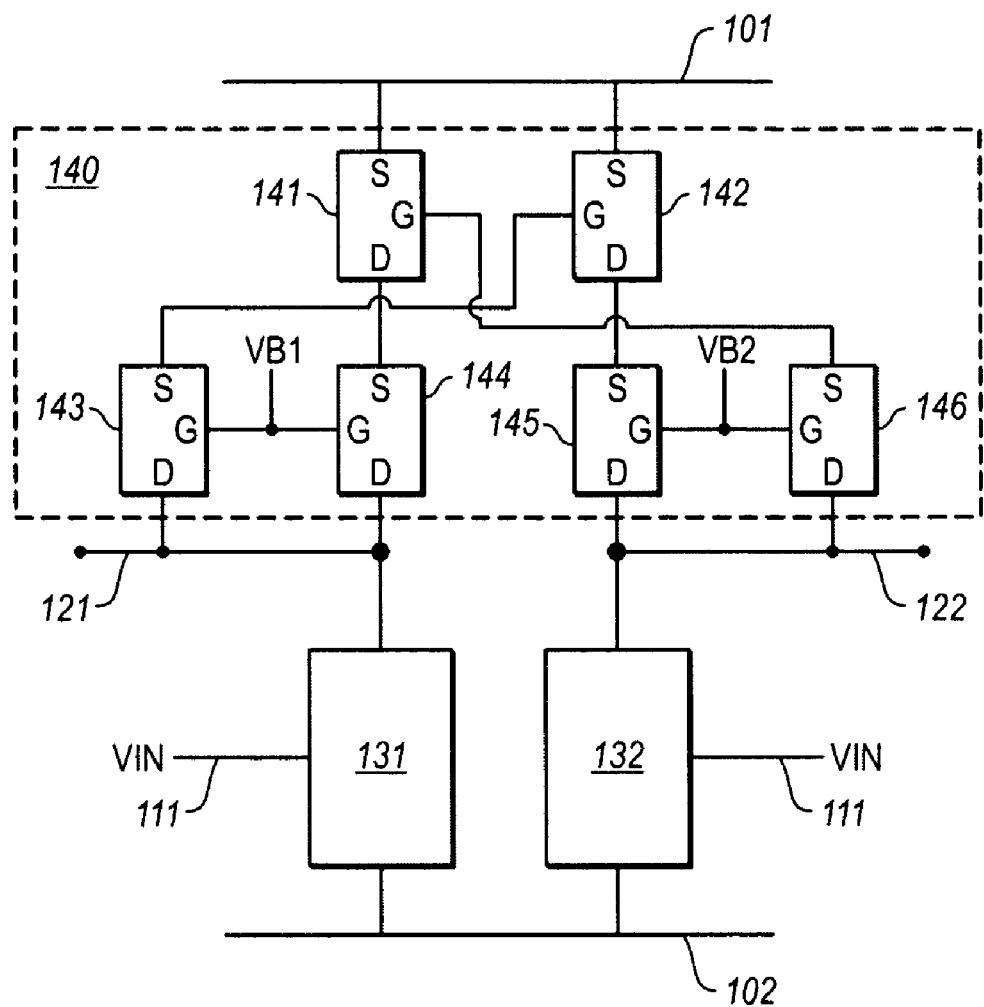
FIG. 1 illustrates a level-shifter circuit in accordance with one embodiment described herein including a network of transistors and two selectable and alternating current paths.

Embodiments described herein relate to a level-shifter that uses an extra pair of cascode transistors to drive the cross-coupled gate terminals of the pull-up (or pull-down) transistors. FIG. 1 illustrates one embodiment of a level-shifter 100 in accordance with the principles described herein.

FIG. 1 is a circuit diagram of a level-shifter circuit 100 that includes two voltage supply nodes 101 and 102. One of these voltage supply nodes will have a higher voltage than the other. However, for purposes of the generalization of FIG. 1, which voltage supply is higher will not be specified in the description of FIG. 1. Rather, in the generalized convention used to describe FIG. 1, the first voltage supply 101 has a "first polarity" whereas the second supply voltage 102 has a "second polarity" opposite the first polarity. The polarities may be "positive" or "negative". A positive polarity with respect to a particular supply voltage of two supply voltages means that the particular supply voltage is higher than the other supply voltage. On the other hand, a negative polarity with respect to the particular supply voltage of two supply voltages means that the particular supply voltage is lower than the other supply voltage. The supply voltage having the higher voltage polarity need not even be higher than ground. Also, the supply voltage having the lower voltage polarity need not even be lower than ground.

The level-shifter circuit 100 includes an input node to which an input signal is applied. The signal to the input node 111 may, for example, be a digital binary signal that has two possible voltage levels as dictated by the supply voltage of the controlling circuit that generates the input signal. In response, the level-shifter circuit 100 generates a corresponding output signal that may also be digital binary with perhaps different voltage levels representing high and/or low digital binary states. There are two intermediate nodes 121 and 122, at least one of which being an output node. However, in one embodiment, intermediate nodes 121 and 122 each represent complementary output nodes.

The level-circuit 100 includes two selectable and alternating current paths 131 and 132. The first selectable current path 131 is configured to channel substantial current between the first intermediate node 121 and the second voltage supply node 102 when a signal of the first polarity is present at the input node 111, and configured to be substantially off when a signal of the second polarity is present at the input node 111. A "signal of the first polarity" means a high binary signal if the first voltage supply 101 is higher than the second voltage supply 102, and means a low binary signal if the first voltage supply 101 is lower than the second voltage supply. A "signal of the second polarity" means a low binary signal if the first voltage supply 101 is higher than the second voltage supply 102, and means a high binary signal if the first voltage supply 101 is lower than the second voltage supply.

The second selectable current path 132 is configured to channel substantial current between the second intermediate node 122 and the second voltage supply node 102 when a signal of the second polarity is present at the input node, and configured to be substantially off when a signal of the first polarity is present at the input node 111.

The level-circuit 100 also includes a network 140 of field-effect transistors 141 through 146. Two of the transistors 141 and 142 are pull-up transistors in the case of the first voltage supply 101 being a higher voltage, or are pull-down transistors in the case of the first voltage supply 101 being a lower voltage. The transistors 141 and 142 each have their source terminals connected to the first voltage supply node 101.

Cascode transistors 144 and 145 each have a source terminal connected to the drain terminal of the corresponding pull-up or pull-down transistors 141 and 142, respectively. Also, their drain terminals are connected to the corresponding intermediate nodes 121 and 122. An additional pair of cascode transistors 143 and 146 also have their drain terminals connected to corresponding intermediate nodes 121 and 122. However, the source terminals of the cascode transistors 143 and 146 are cross-connected to the gate terminals of the corresponding pull-up or pull-down transistors 142 and 141, respectively. Furthermore, the gate terminals of the cascode transistors 143 and 144 are connected to each other and to a first bias voltage VB1. The gate terminals of the cascode transistors 145 and 146 are also connected to each other and to a second bias voltage VB2, which may optimally be the same as the first bias voltage VB1.

As previously mentioned, the first selectable current path 131 channels substantial current when the input signal has one binary state, and is configured to be substantially off when the input signal has the other binary state. The second selectable current path 132 operates in a complementary manner.

In this context, a selectable current path channels substantial current between the corresponding intermediate node and the second supply voltage node when sufficient current is channeled that the voltage at the intermediate node migrates towards the second supply voltage such that the voltage at the gate terminal of the cross-coupled transistor migrates towards the second supply voltage sufficient to begin to turn the cross-coupled transistor on. For instance, if the first selectable current path 131 is channeling substantial current, the transistor 142 will begin to turn on. Likewise, if the second selectable current path 132 is channeling substantial current, the transistor 141 will begin to turn on.

In this context, a selectable current path is substantially off if there is insufficient current in the current path to draw the voltage at the corresponding intermediate node to be sufficient to turn on the cross-coupled pull-down or pull-up transistor. For instance, if the first selectable current path 131 is substantially off, the voltage at the intermediate node 121 will be sufficient that the source voltage of the cascode transistor 143 and the gate voltage of the cross-coupled transistor 142 will be sufficient to keep the cross-coupled transistor 142 off. Likewise, if the second selectable current path 132 is substantially off, the voltage at the intermediate node 122 will be sufficient that the source voltage of the cascode transistor 146 and the gate voltage of the cross-coupled transistor 141 will be sufficient to keep the cross-coupled transistor 141 off.

Figure 2:
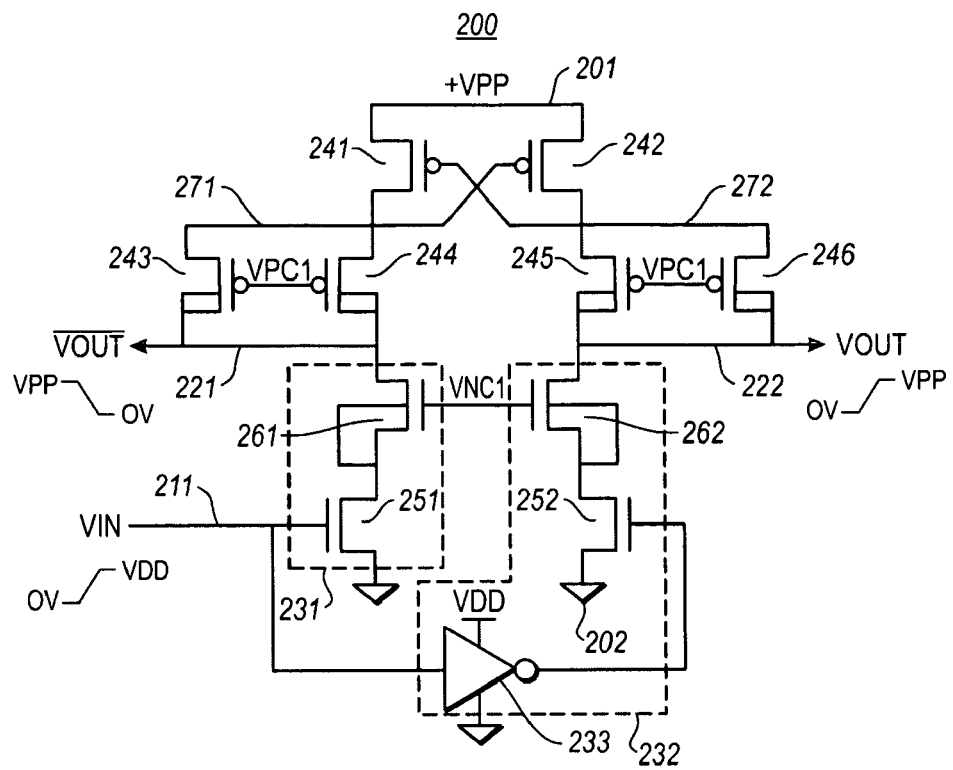
FIG. 2 illustrates a more specific embodiment of a level-shifter in which the network of transistors are p-type field-effect transistors, and in which each alternating current path includes a series combination of an n-type transistor controlled by the input signal (or the input signal inverted) and a corresponding n-type cascode transistor.

FIG. 2 illustrates one specific embodiment 200 of the circuit 100 of FIG. 1. Elements 201, 202, 211, 221, 222, 231, 232, 241, 242, 243, 244, 245 and 246 of FIG. 2 are specific embodiments of the more general elements 101, 102, 111, 121, 122, 131, 132, 141, 142, 143, 144, 145 and 146, respectively, of FIG. 1. The first and second bias voltages VB1 and VB2 of FIG. 1 are represented in FIG. 2 as both being the same voltage VPC1. In this embodiment, the transistors 141 through 146 of the first polarity are p-type field-effect transistors 241 through 246, respectively. The first voltage supply node 201 is a high voltage supply (also called herein +VPP), and the second voltage supply node 202 is a low voltage supply (shown as ground). Note that the voltage levels of the input voltage VIN varies from ground to VDD, whereas the output voltage VOUT varies from ground to VPP thereby accomplishing the level-shifting function.

In the case of FIG. 2, the first selectable current path 231 includes an nMOS pull-down field-effect transistor 251 having its source terminal connected to ground, and having its gate terminal connected to the input node 211. The first selectable current path 231 also includes an n-type cascode transistor 261 having its gate terminal biased to a voltage VNC1, having a source terminal connected to the drain terminal of the pull-down transistor 251, and having a drain terminal connected to the intermediate node 221. In this case, the intermediate node 221 is an output node designed to output the complement VOUT(BAR) of the input voltage VIN, but at level-shifted voltages.

Similarly, in the case of FIG. 2, the second selectable current path 232 includes an nMOS pull-down field-effect transistor 252 having its source terminal connected to ground, and having its gate terminal connected through an inverter 233 to the input node 211. Accordingly, the gate terminal of the pull-down transistor 252 receives the binary complement of the input voltage VIN. The second selectable current path 232 also includes an n-type cascode transistor 262 have its gate terminal biased to the voltage VNC1, having a source terminal connected to the drain terminal of the pull-down transistor 252, and having a drain terminal connected to the intermediate node 222. In this case, the intermediate node 222 is an output node designed to track the input voltage VIN, but at level-shifted voltages.

Figure 6:
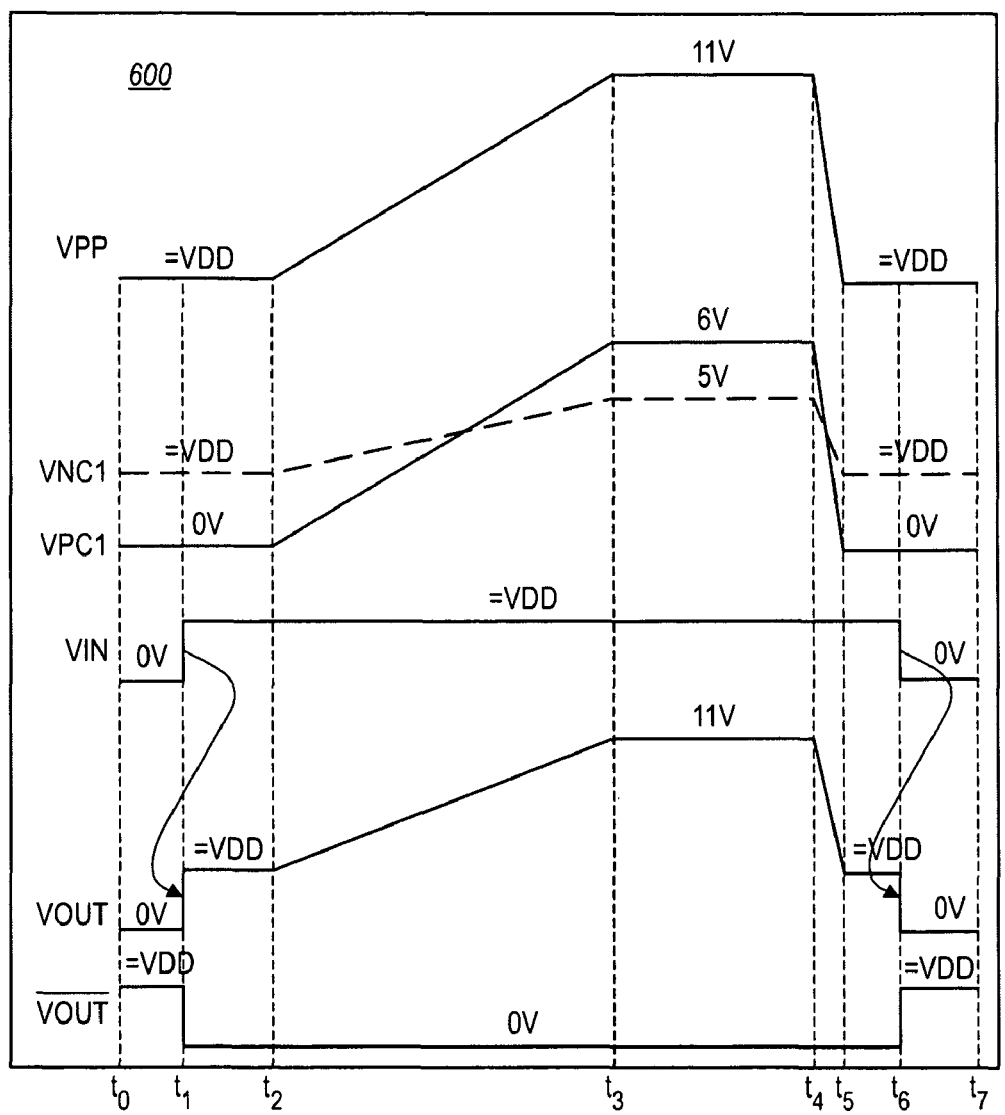
FIG. 6 illustrates a signal timing diagram for various signals used in the operation of the level-shifting circuits of FIGS. 2 and 4.

The operation of the level-shifter circuit 200 will now be described with respect to the signal timing diagram 600 of FIG. 6. The circuit timing diagram 600 illustrates the state of several signals and voltage levels (collectively referred to herein as "signals") include VPP, VNC1, VPC1, VIN, VOUT and VOUT(BAR) and are applicable in the operation of FIG. 2. The signals are also applicable in the case of FIG. 4, although the bias voltage VNC1 is no longer needed in the case of FIG. 4 due to the elimination of the n-type cascode transistor pair.

Referring first to the input signal VIN, at time t0, the input signal VIN is low (at 0 volts in this case). In that condition, transistor 251 remains off, thereby keeping the selectable current path 231 off. Bias voltage VNC1 is VDD at time t0 thereby keeping the transistor 262 on. The input signal is inverted using inverter 232 to thereby generate a high signal VDD at the gate of transistor 252. Thus, a current path is established through the selectable current path 232, thereby maintaining the output voltage VOUT at 0 volts. VPC1 is low at 0 volts at time t0, and thus transistors 243 and 244 are on. There is thus a low voltage at node 272 causing the transistor 241 to be on. Accordingly, VOUT(BAR) is maintained high by being pulled to VPP through transistors 241 and 244. This means that node 271 is also high, thereby keeping transistor 242 off, allowing the output voltage VOUT to remain low at 0 volts.

At time t1, the input signal VIN transitions high (to VDD), and remains there until time t6, when the input signal VIN transitions low (back to 0 volts). When the input signal VIN transitions high to VDD, the output signal VOUT transitions to VPP. For instance, at the beginning of the transition at time t1, transistors 241 and 244 are on, holding VOUT(BAR) high, while transistors 251 and 261 are off, and transistors 252 and 262 are on, holding VOUT low, while transistors 242 and 245 are off. As the input signal VIN rises, transistor 251 turns on, which, by pulling down on the source of transistor 261, also turns transistor 261 on. These two transistors 251 and 261 in series pull down on output voltage VOUT(bar). The current is substantial in that it is strong enough to sink all the current being supplied by transistors 241 and 244, which are on, while additionally pulling voltage VOUT(BAR) down. As voltage VOUT(BAR) is pulled down, node 271 will also be pulled down part way, which will begin to turn transistor 242 on. This pulls up on the source of transistor 245, which thereby turns transistor 245 on. The two transistors 242 and 245 in series pull up on output voltage VOUT, and transistor 242 will pull up on node 272 through the path formed by transistors 245 and 246 and intermediate node 222. Transistors 252 and 262 are off because transistor 252 is driven by the inverse of VIN. This allows output voltage VOUT to rise all the way to VPP, with rise time set by the capacitive load on VOUT. As node 272 rises, transistor 241 will turn off, which also turns off transistor 244, allowing output voltage VOUT (BAR) to go all the way to zero, completing the transition.

In particular, the supply voltage VPP of the controlled circuit is initially the same as the supply voltage VDD of the controlling circuit. Thus, from time t0 to time t2, the voltage VPP is the same as the voltage VDD. Between times t0 and t2, bias voltage VPC1 is at ground, whereas the bias voltage VNC1 is at VDD.

From time t2 to time t3, however, the supply voltage VPC1 transitions from VDD to some higher voltage (in this case, approximately 11 volts). The output voltage VOUT, being tied to VPP, also transitions from VDD to the high voltage (approximately 11 volts in this case) between times t2 and t3. Between times t2 and t3, bias voltage VPC1 transitions from 0 volts to approximately 6 volts and approximately fractionally tracks the increase in VPP, whereas bias voltage VNC1 transitions from VDD to approximately 5 volts once again fractionally tracking the increase in VPP. With this biasing configuration, the voltage across any of the transitions (Gate to Drain, Gate to Source, and Drain to Source) is limited to approximately half of VPP.

Between times t3 and t4, the supply voltage VPP is maintained at its high value. The voltages VOUT, VPC1, and VNC1 are also maintained at the same values that they were at time t3.

From time t4 to time t5, the supply voltage VPP is reduced back down to VDD. Accordingly, VOUT, VNC1 and VPC1 are returned to their values that they were at between times t1 and t2.

At time t6, the input signal VIN switches from high (VDD) to low (0 volts). Accordingly, VOUT transitions from high (VPP—which is the same as VDD at time t6) to low (0 volts). The signals stay the same from time t6 to time t7. The transition from a binary high to low in the input signal VIN causes the state of the circuit 200 to return to the state that it was at before time t1 at time t0.

Previously, there was no cross-coupled pair corresponding to transistor 243 or 246 in a level-shifter circuit. Rather, the source terminals of the transistors 244 and 245 were directly connected to the gate terminals of the transistors 241 and 242. A limitation of that circuit is that the current flowing through transistors 241, 244, 261 and 251 at the beginning of the transition, limits how low node 271 can be pulled (where node 271 would in that case be the connection between the source terminal of the transistor 244 and the drain terminal of transistor 241). The minimum that node 271 could be pulled to in that case, with no current flowing, is a pMOS threshold above the bias voltage VPC1. With current flowing, node 271 would be even higher than that, by an amount determined by the width to length ration (W/L or size) of transistor 244. The higher node 271 is, the less strongly transistor 242 will be turned on, and the slower will be the rising transition on VOUT. If node 271 is above a certain value, transistor 242 will just stay off, or will not be turned on strongly enough to overcome leakage current on VOUT, and the circuit will never switch.

One way to deal with this limitation is to increase the W/L of transistor 244. However this can take a very large increase in W in a given case to sufficiently decrease the voltage at node 271. The resultant area increase and additional capacitance on node 271 are undesirable. FIG. 2, on the other hand, deals with the limitation of the original circuit in the following way. Node 271, instead of being connected to the junction between transistor 241 and 244, is connected to source terminal of added transistor 243, which has its drain terminal connected to output node VOUT(BAR). Also, node 272, instead of being connected to the junction between transistors 242 and 245, is connected to added transistor 246, which is connected to output node VOUT.

With these connections, as long as VOUT(BAR) can be pulled down sufficiently, node 271 will be quickly pulled to its minimum value, independent of the current flowing through transistors 241, 244, 261 and 251. This turns on transistor 242 strongly, and much more quickly, pulling up output voltage VOUT and node 272, which turns off transistor 241 and the transition completes. Since node 272 is now pulled up by transistor 245, instead of by transistor 242, and thus rises with, or slightly after, VOUT, it might be thought that this would potentially slow down the overall switching transition. However, at least at the conditions that have the slowest switching time, by turning on transistor 242 stronger and faster, the overall switching time improves more than the slight delay from the rise of VOUT to the rise of node 272.

Figure 3:
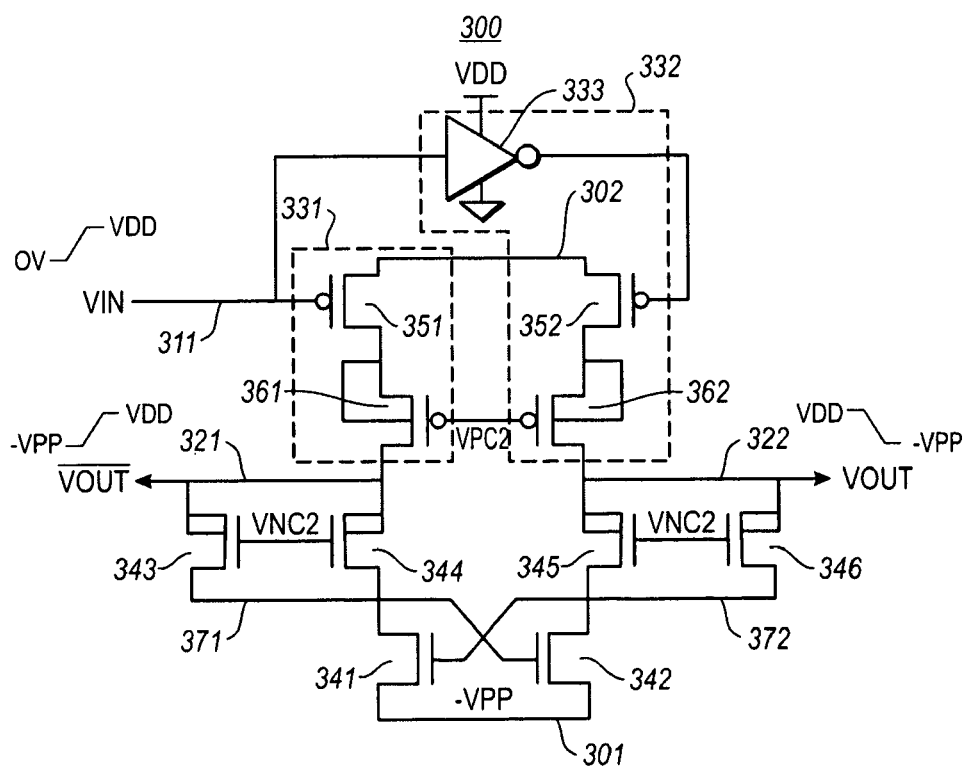
FIG. 3 illustrates a specific embodiment of a level-shifter of FIG. 1 in which the network of transistors are n-type field-effect transistors, and in which each alternating current path includes a series combination of a p-type transistor controlled by the input signal (or the input signal inverted) and a corresponding p-type cascode transistor.

FIG. 3 illustrates a level-switching circuit 300 that is a complementary version of the level-switching circuit 200 shown in FIG. 2.

Figure 7:
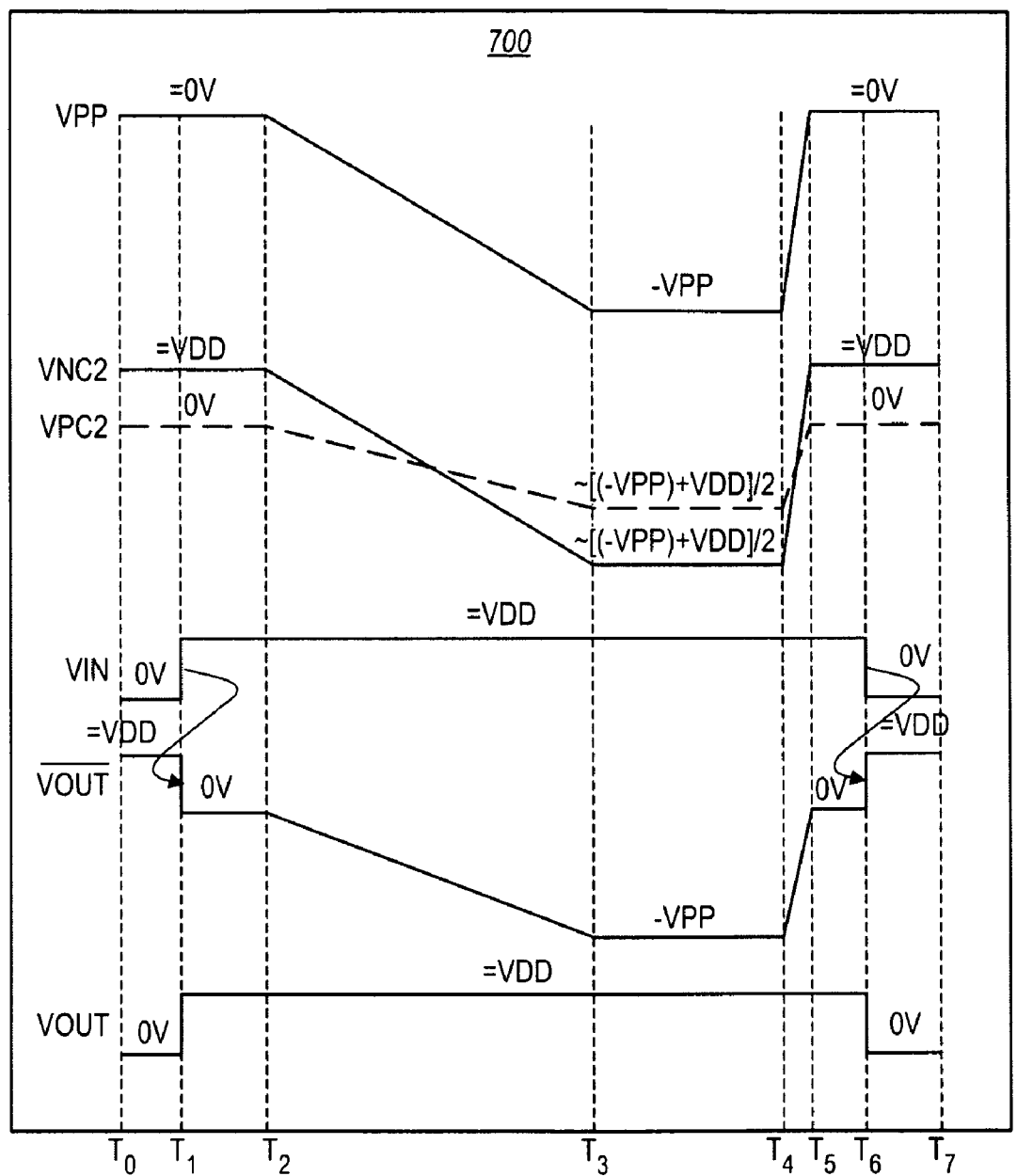
FIG. 7 illustrates a signal timing diagram for various signals used in the operation of the level-shifting circuits of FIGS. 3 and 5.

FIG. 3 illustrates another specific embodiment 300 of the circuit 100 of FIG. 1. Elements 301, 302, 311, 321, 322, 331, 332, 341, 342, 343, 344, 345 and 346 of FIG. 3 are specific embodiments of the more general elements 101, 102, 111, 121, 122, 131, 132, 141, 142, 143, 144, 145 and 146, respectively. The first and second bias voltages VB1 and VB2 of FIG. 1 are represented in FIG. 3 as both being the same voltage VNC2. The bias voltages VPC2 and VNC2 would also be adjusted accordingly in order to reduce the voltages across the transistor (gate to source, source to drain and gate to drain) to half of the output voltage (VPP). Specifically, FIG. 7 illustrates a signal timing diagram 700 showing how the signals VPP, VNC2, VPC2, VIN, VOUT(BAR) and VOUT might operate in the context of FIG. 3 (and also FIG. 5, although the signal VPC2 would not be used in FIG. 5). In this embodiment, the transistors 141 through 146 of the first polarity are n-type field-effect transistors 341 through 346, respectively. The voltage supply node 101 is a low voltage supply 301 (also called herein −VPP), and the voltage supply node 102 is a high voltage supply 302 (shown as VDD). Note that the voltage levels of the input voltage vary from ground to VDD, whereas the output voltage varies from −VPP to VDD thereby accomplishing the level-shifting function. The improved range of the level-shifter circuit 300 is achieved by allowing the voltages at nodes 371 and 372 to be closer to voltage supply 302.

Figure 4:
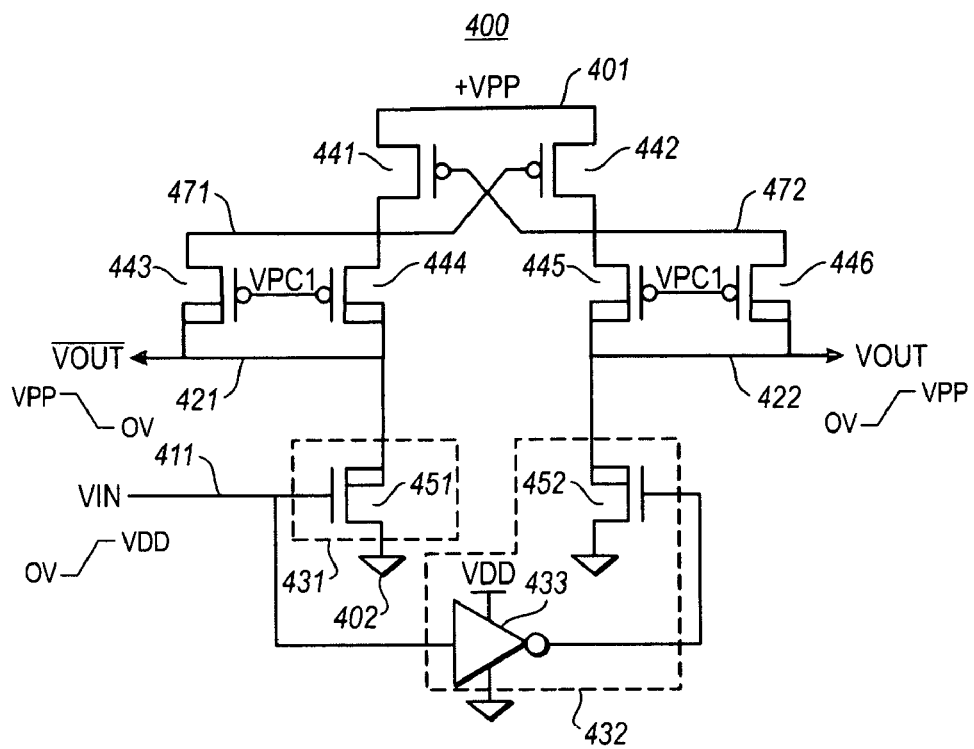
FIG. 4 illustrates a specific embodiment of a level-shifter of FIG. 1 in which the network of transistors are p-type field-effect transistors, and in which each alternating current path includes a single high voltage n-type transistor controlled by the input signal (or the input signal inverted)

FIG. 4 is another embodiment of a level-shifter circuit 400 and is similar to the level-shifter circuit 200 of FIG. 2, except that the low voltage transistors 251 and 261 of the selectable current path 231 of FIG. 2 are replaced by a simpler selectable circuit path 431 having but a single high voltage transistor 451. Similarly, the low voltage transistors 252 and 262 (and the inverter 233) of the selectable current path 232 of FIG. 2 are replaced by a simpler selectable current path 432 having but a single high voltage transistor 452 along with the inverter 433. Elements 401, 402, 411, 421, 422, 441, 442, 443, 444, 445 and 446 of FIG. 4 may be similar to the respective elements 201, 202, 211, 221, 222, 241, 242, 243, 244, 245 and 246 of FIG. 2. The improved range of the level-shifter circuit 400 is achieved by allowing the voltages at nodes 471 and 472 to be closer to voltage supply 402.

Figure 5:
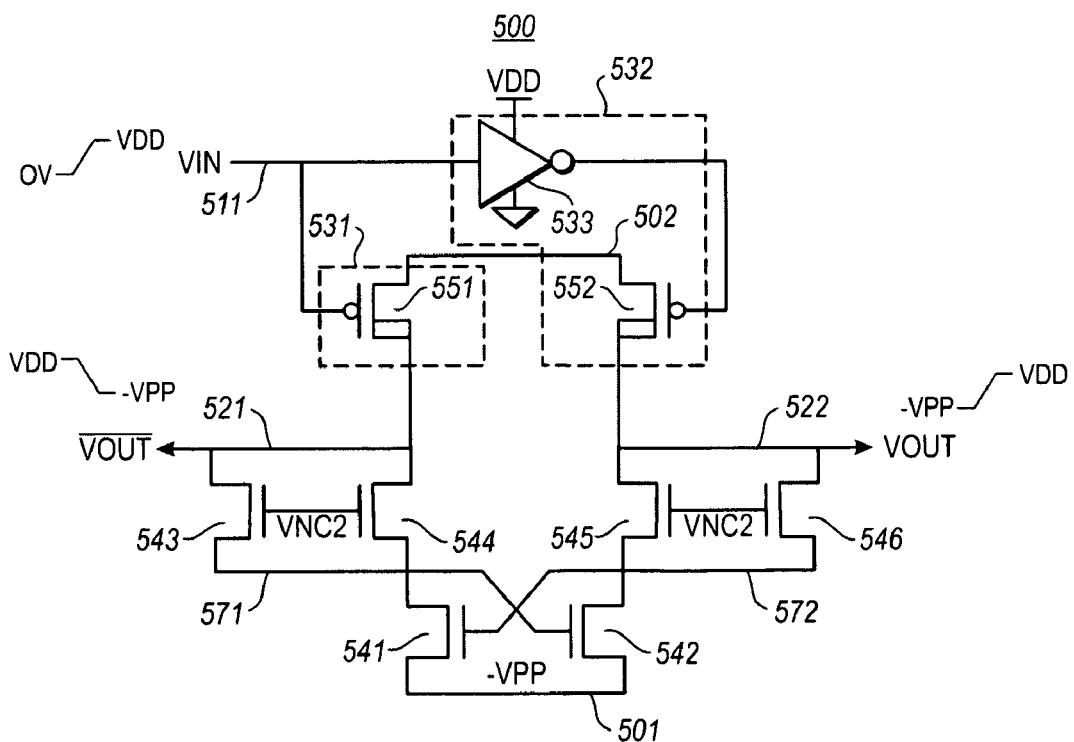
FIG. 5 illustrates a specific embodiment of a level-shifter of FIG. 1 in which the network of transistors are n-type field-effect transistors, and in which each alternating current path includes a single high voltage p-type transistor controlled by the input signal (or the input signal inverted)

FIG. 5 is another embodiment of a level-shifter circuit 500 and is similar to the level-shifter circuit 300 of FIG. 3 except that the low voltage transistors 351 and 361 of the selectable current path 331 of FIG. 3 are replaced by a simpler selectable current path 531 having but a single high voltage transistor 551. Similarly, the low voltage transistors 352 and 362 (along with the inverter 333) of the selectable current path 332 of FIG. 3 are replaced by a simpler selectable current path 532 having but a single high voltage transistor 552 and the inverter 533. Elements 501, 502, 511, 521, 522, 541, 542, 543, 544, 545 and 546 of FIG. 5 may be similar to the respective elements 301, 302, 311, 321, 322, 341, 342, 343, 344, 345 and 346 of FIG. 3. The improved range of the level-shifter circuit 500 is achieved by allowing the voltages at nodes 571 and 572 to be closer to voltage supply 502.

The level-shifter circuits described herein permit for fast and reliable level-shifted switching even when the voltage differential of the output signal levels are close to or even below the voltage differential of the input signal levels.

Figure 8:
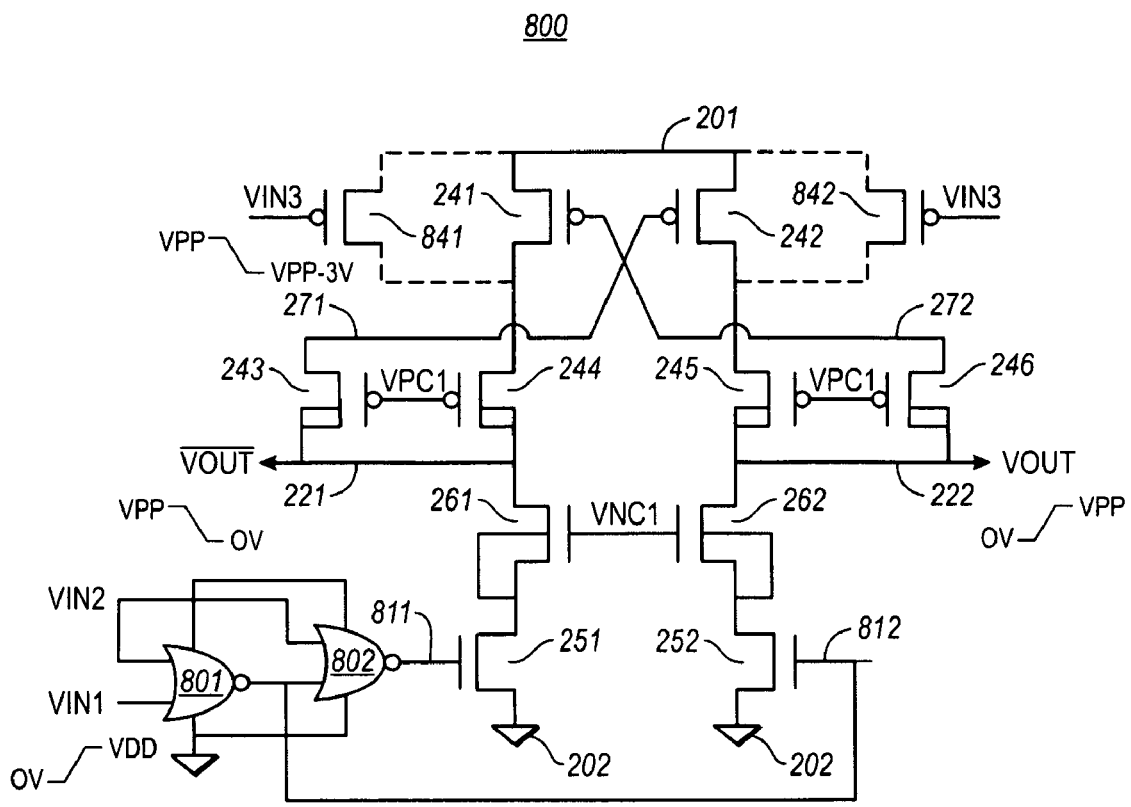
FIG. 8 illustrates an alternative embodiment in which the level-shifter is configurable to output either complementary, or non-complementary signals.

The level-shifter circuits 200, 300, 400 and 500 output complementary output signals. FIG. 8 illustrates a configurable level-shifter circuit 800 that is similar to the level-shifter circuit 200 of FIG. 2, except that the circuit 800 may be configured to output complementary output signals, or non-complementary output signals. In FIG. 8, circuit elements that are similar to those of FIG. 2 are labeled using the same numbers that are used in FIG. 2. In addition, instead of an inverter between the two input terminals 811 and 812, there is a network of NOR gates 801 and 802 configured as shown and that receive two input signals VIN1 and VIN2. Another set of p-type field-effect transistors 841 and 842 are provided where the dashed lines indicate where the transistors 841 and 842 would be connected. The gate terminals of the transistors 841 and 842 each receive a third input signal VIN3, which is a level-shifted and inverted version of the logic signal VIN2.

In operation, when VIN2 is equal to 0 volts, and VIN3 is equal to VPP, the circuit 800 operates in the same manner described for the circuit 200 of FIG. 2. However, when VIN2 is equal to VDD, and VIN3 is equal to VPP minus 3 volts (approximately), both current paths through transistors 251 and 252 are off, and both VOUT and VOUT(BAR) are pulled high to the voltage at the voltage supply 201 through transistors 841 and 842.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A level-shifter circuit comprising:

a first voltage supply node configured to receive a first voltage having a first polarity;

a second voltage supply node configured to receive a second voltage having a second polarity opposite the first polarity;

an input node;

a first and second intermediate nodes, at least one of which being an output node;

a first selectable current path configured to channel substantial current between the first intermediate node and the second voltage supply node when a signal of the first polarity is present at the input node, and configured to be substantially off when a signal of the second polarity is present at the input node;

a second selectable current path configured to channel substantial current between the second intermediate node and the second voltage supply node when a signal of the second polarity is present at the input node, and configured to be substantially off when a signal of the first polarity is present at the input node; and a plurality of field-effect transistors each having a gate terminal, a source terminal, and a drain terminal, the plurality of field-effect transistors comprising:

a first transistor having its source terminal connected to the first voltage supply node;

a second transistor having its source terminal connected to the first voltage supply node;

a third transistor having the source terminal connected to the gate terminal of the second transistor and not connected to the drain terminal of the first transistor, and a drain terminal connected to the first intermediate node;

a fourth transistor having its source terminal connected to the drain terminal of the first transistor, the drain terminal of the fourth transistor connected to the first intermediate node, the gate terminal of the fourth transistor connected to the gate terminal of the third transistor and to a first bias voltage source that provides a first bias voltage;

a fifth transistor having its source terminal connected to the drain terminal of the second transistor, and a drain terminal connected to the second intermediate node; and a sixth transistor having the source terminal connected to the gate terminal of the first transistor and not connected to the drain terminal of the second transistor, the drain terminal of the sixth transistor connected to the second intermediate node, the gate terminal of the sixth transistor connected to the gate terminal of the fifth transistor and to a second bias voltage source that provides a second bias voltage.

2. The level-shifter circuit in accordance with claim 1, wherein the first bias voltage source and the second bias voltage source are the same, thereby providing the same bias voltage to the gate terminals of each of the third, fourth, fifth and sixth transistors.

3. The level-shifter circuit in accordance with claim 1, wherein the first polarity is positive such that the signal of the first polarity is a high signal relative to the signal of the second polarity, the first voltage supply of the first polarity is a relatively high voltage supply as compared to the second voltage supply, and the plurality of field-effect transistors are p-type field-effect transistors, and wherein the second polarity is negative such that the signal of the second polarity is a low signal relative to the signal of the first polarity, and the second voltage supply of the second polarity is a low voltage supply as compared to the first voltage supply.

4. The level-shifter circuit in accordance with claim 1, wherein the first polarity is negative such that the signal of the first polarity is a low signal relative to the signal of the second polarity, the first voltage supply of the first polarity is a relatively low voltage supply as compared to the second voltage supply, and the plurality of field-effect transistors are n-type field-effect transistors, and wherein the second polarity is positive such that the signal of the second polarity is a high signal relative to the signal of the first polarity, and the second voltage supply of the second polarity is a high voltage supply as compared to the first voltage supply.

5. The level-shifter circuit in accordance with claim 1, wherein the first selectable current path comprises a plurality of transistors, each having a gate terminal, a source terminal, and a drain terminal, the plurality of transistors comprising:

a seventh transistor having the gate terminal being the input node, the source terminal connected to the second voltage supply node; and an eighth transistor having the source terminal connected to the drain terminal of the seventh transistor, having the drain terminal connected to the first intermediate node, and having its the gate terminal connected to a third bias voltage source that provides a third bias voltage.

6. The level-shifter circuit in accordance with claim 5, wherein the first voltage supply node is configured to receive a variable voltage, wherein the first, second, and third bias voltages are dependent on the variable voltage.

7. The level-shifter circuit in accordance with claim 5, further comprising an inverter having its input terminal connected to the input node, wherein the second selectable current path comprises another plurality of transistors, each having a gate terminal, a source terminal, and a drain terminal, the another plurality of transistors comprising:

a ninth transistor having the gate terminal connected to the output terminal of the inverter, and the source terminal connected to the second voltage supply node; and a tenth transistor having the source terminal connected to the drain terminal of the ninth transistor, having the drain terminal connected to the second intermediate node, and having the gate terminal connected to the third bias voltage source.

8. The level-shifter circuit in accordance with claim 7, wherein the first polarity is positive such that the signal of the first polarity is a high signal relative to the signal of the second polarity, the first voltage supply of the first polarity is a relatively high voltage supply as compared to the second voltage supply, and the plurality of field-effect transistors are p-type field-effect transistors, wherein the second polarity is negative such that the signal of the second polarity is a low signal relative to the signal of the first polarity, the second voltage supply of the second polarity is a low voltage supply as compared to the first voltage supply, and the another plurality of transistors are n-type field-effect transistors.

9. The level-shifter circuit in accordance with claim 7, wherein the first polarity is negative such that the signal of the first polarity is a low signal relative to the signal of the second polarity, the first voltage supply of the first polarity is a relatively low voltage supply as compared to the second voltage supply, and the plurality of field-effect transistors are n-type field-effect transistors, and wherein the second polarity is positive such that the signal of the second polarity is a high signal relative to the signal of the first polarity, the second voltage supply of the second polarity is a high voltage supply as compared to the first voltage supply, and the transistors of the second polarity are p-type field-effect transistors.

10. The level-shifter circuit in accordance with claim 1, wherein the first selectable current path comprises a first high voltage transistor having a gate terminal, a source terminal, and a drain terminal, the gate terminal of the first high-voltage transistor being the input node, the source terminal of the first high-voltage transistor connected to the second voltage supply node, and the drain terminal of the first high-voltage transistor connected to the first intermediate node.

11. The level-shifter circuit in accordance with claim 10, further comprising an inverter having its input terminal connected to the input node, and wherein the second selectable current path comprises a second high-voltage transistor having a gate terminal, a source terminal, and a drain terminal, the gate terminal of the second high-voltage transistor being connected to the output terminal of the inverter, the source terminal of the second high-voltage transistor connected to the second voltage supply node, and the drain terminal of the second high-voltage transistor to the second intermediate node.

12. The level-shifter circuit in accordance with claim 11, wherein the first polarity is positive such that the signal of the first polarity is a high signal relative to the signal of the second polarity, the first voltage supply of the first polarity is a relatively high voltage supply as compared to the second voltage supply, and the plurality of field-effect transistors are p-type field-effect transistors, and wherein the second polarity is negative such that the signal of the second polarity is a low signal relative to the signal of the first polarity, the second voltage supply of the second polarity is a low voltage supply as compared to the first voltage supply, and the first and second high voltage transistors are n-type field-effect transistors.

13. The level-shifter circuit in accordance with claim 11, wherein the first polarity is negative such that the signal of the first polarity is a low signal relative to the signal of the second polarity, the first voltage supply of the first polarity is a relatively low voltage supply as compared to the second voltage supply, and the plurality of field-effect transistors are n-type field-effect transistors, and wherein the second polarity is positive such that the signal of the second polarity is a high signal relative to the signal of the first polarity, the second voltage supply of the second polarity is a high voltage supply as compared to the first voltage supply, and the first and second high voltage transistors are p-type field-effect transistors.

14. The level-shifter circuit in accordance with claim 1, wherein the first voltage supply node is configured to receive a variable voltage during operation.

15. The level-shifter circuit in accordance with claim 14, wherein the first and second bias voltages are dependent on the variable voltage.

16. The level-shifter circuit in accordance with claim 1, wherein the third, fourth, fifth and sixth transistors are each high voltage transistors.

17. A method for a level-shifter circuit that includes a first voltage supply node configured to receive a first voltage having a first polarity;

a second voltage supply node configured to receive a second voltage having a second polarity opposite the first polarity; an input node;

a first and second intermediate nodes, at least one of which being an output node;

a first selectable current path configured to channel substantial current between the first intermediate node and the second voltage supply node when a signal of the first polarity is present at the input node, and configured to be substantially off when a signal of the second polarity is present at the input node;

a second selectable current path configured to channel substantial current between the second intermediate node and the second voltage supply node when a signal of the second polarity is present at the input node, and configured to be substantially off when a signal of the first polarity is present at the input node; and a plurality of field-effect transistors each having a gate terminal, a source terminal, and a drain terminal, the plurality of field-effect transistors comprising:

a first transistor having its source terminal connected to the first voltage supply node;

a second transistor having its source terminal connected to the first voltage supply node;

a third transistor having its source terminal connected to the gate terminal of the second transistor and connected to the gate terminal of the second transistor and not connected to the drain terminal of the first transistor, and a drain terminal connected to the first intermediate node;

a fourth transistor having its source terminal connected to the drain terminal of the first transistor, the drain terminal of the fourth transistor connected to the first intermediate node, the gate terminal of the fourth transistor connected to the gate terminal of the third transistor and to a first bias voltage source that provides a first bias voltage;

a fifth transistor having its source terminal connected to the drain terminal of the second transistor and connected to the gate terminal of the second transistor and not connected to the drain terminal of the first transistor, and a drain terminal connected to the second intermediate node; and a sixth transistor having its source terminal connected to the gate terminal of the first transistor, the drain terminal of the sixth transistor connected to the second intermediate node, the gate terminal of the sixth transistor connected to the gate terminal of the fifth transistor and to a second bias voltage source that provides a second bias voltage, the method comprising:

configuring an input node to receive an input signal of the first polarity to thereby cause the first intermediate node to be pulled towards the voltage applied on the second voltage supply node and to thereby cause the second intermediate node to be pulled towards the voltage, applied at the first voltage supply node.

18. The method in accordance with claim 17, further comprising:

configuring the input node to receive an input signal of the second polarity to thereby cause the first intermediate node to be pulled towards the voltage applied on the first voltage supply node and to thereby cause the second intermediate node to be pulled towards the voltage applied at the second voltage supply node.

19. The method in accordance with claim 17, further comprising:

configuring the level-shifter circuit to receive the first voltage having a magnitude that increases.

20. The method in accordance with claim 19, further comprising:

configuring the level-shifter circuit to cause the first and second bias voltages to vary proportionally to variations of the first supply voltage.

21. The method in accordance with claim 17, further including configuring the third transistor to have the source terminal connected to the gate terminal of the second transistor and not connected to the drain terminal of the first transistor; and configuring the sixth transistor to have the source terminal connected to the gate terminal of the first transistor and not connected to the drain terminal of the second transistor.

* * * * *